United States Patent
Jeong

(10) Patent No.: US 9,548,339 B2
(45) Date of Patent: Jan. 17, 2017

(54) ORGANIC LIGHT EMITTING DIODE DISPLAY DEVICE

(71) Applicant: SAMSUNG DISPLAY CO., LTD., Yongin-si, Gyeonggi-do (KR)

(72) Inventor: Heeseong Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/842,767

(22) Filed: Sep. 1, 2015

(65) Prior Publication Data
US 2016/0240589 A1    Aug. 18, 2016

(30) Foreign Application Priority Data
Feb. 13, 2015  (KR) .......................... 10-2015-0022474

(51) Int. Cl.
*H01L 27/32* (2006.01)
*H01L 51/52* (2006.01)

(52) U.S. Cl.
CPC ......... *H01L 27/322* (2013.01); *H01L 27/3211* (2013.01); *H01L 51/5275* (2013.01)

(58) Field of Classification Search
None
See application file for complete search history.

(56) References Cited

U.S. PATENT DOCUMENTS

| | | | | |
|---|---|---|---|---|
| 6,911,772 B2* | 6/2005 | Cok | ..................... | H01L 27/3211 313/113 |
| 8,174,179 B2* | 5/2012 | Suh | ........................ | H01L 27/322 313/110 |
| 2004/0217694 A1* | 11/2004 | Cok | ..................... | G09G 3/3216 313/504 |
| 2005/0186330 A1* | 8/2005 | Kim | ..................... | H01L 51/0017 427/66 |
| 2006/0152150 A1* | 7/2006 | Boerner | ............. | C09K 11/0883 313/506 |
| 2008/0284324 A1* | 11/2008 | Chun | .................. | H01L 27/3211 313/504 |
| 2008/0296600 A1 | 12/2008 | Kwack et al. | | |
| 2011/0121271 A1 | 5/2011 | Jeon et al. | | |
| 2011/0240970 A1* | 10/2011 | Park | ..................... | H01L 27/3211 257/40 |

(Continued)

FOREIGN PATENT DOCUMENTS

KR  10-2008-0105308  12/2008
KR  10-2010-0053254  5/2010
(Continued)

*Primary Examiner* — Lex Malsawma
(74) *Attorney, Agent, or Firm* — Lewis Roca Rothgerber Christie LLP

(57) ABSTRACT

An organic light emitting diode (OLED) display device includes: a first substrate comprising red, green, and blue pixel areas; a first electrode on the first substrate; red, green, and blue organic light emitting layers on the first electrode at the red, green, and blue pixel areas, respectively; a second electrode on the red, green, and blue organic light emitting layers; a capping layer on the second electrode, and having a greater thickness at the red and green pixel areas than a thickness at the blue pixel area; a thin film encapsulation layer on the capping layer; and a red color filter on the thin film encapsulation layer at the red pixel area.

15 Claims, 7 Drawing Sheets

(56) References Cited

U.S. PATENT DOCUMENTS

| | | | |
|---|---|---|---|
| 2012/0119239 A1 | 5/2012 | Kim et al. | |
| 2012/0319145 A1* | 12/2012 | Weaver | H01L 27/3211 257/89 |
| 2013/0001532 A1* | 1/2013 | Hwang | H01L 51/0058 257/40 |
| 2014/0131674 A1* | 5/2014 | Park | H01L 27/3209 257/40 |
| 2014/0284566 A1* | 9/2014 | Yoo | H01L 51/5012 257/40 |
| 2014/0291627 A1* | 10/2014 | Kim | H01L 51/0013 257/40 |
| 2015/0001480 A1* | 1/2015 | Kim | H01L 51/5265 257/40 |

FOREIGN PATENT DOCUMENTS

| | | |
|---|---|---|
| KR | 10-2011-0058126 | 6/2011 |
| KR | 10-2012-0053340 | 5/2012 |

\* cited by examiner

ORGANIC LIGHT EMITTING DIODE DISPLAY DEVICE

CROSS-REFERENCE TO RELATED APPLICATION

This application claims priority to and the benefit of Korean Patent Application No. 10-2015-0022474, filed on Feb. 13, 2015, in the Korean Intellectual Property Office, the disclosure of which is incorporated herein in its entirety by reference.

BACKGROUND

1. Field

Aspects of embodiments of the present invention relate to an organic light emitting diode (OLED) display device.

2. Description of the Related Art

An organic light emitting diode (OLED) display device is a self-emission-type display device displaying an image using an OLED element which emits light. Such an OLED display device may not require an additional light source, in a manner dissimilar to that of a liquid crystal display (LCD) device, and thus may have a relatively reduced thickness and weight. Further, an OLED display device has characteristics such as relatively low power consumption, relatively high luminance, and relatively high speed of response, thus gaining attention as a next generation display device.

In general, an OLED element includes a hole injection electrode, an organic light emitting layer, and an electron injection electrode. A hole injected from the hole injection electrode and an electron injected from the electron injection electrode are combined with one another within the organic light emitting layer to form an exciton. The OLED element emits light by energy generated when the exciton falls from an excited state to a ground state.

It is to be understood that this background of the technology section is intended to provide useful background for understanding the technology and as such disclosed herein, the technology background section may include ideas, concepts or recognitions that do not constitute prior art.

SUMMARY

Aspects of embodiments of the present invention relate to an organic light emitting diode (OLED) display device, and an OLED display device enhanced in the light efficiency thereof and significantly reduced in a color distortion phenomenon that occurs based on a viewing angle.

Embodiments of the present invention are directed to an organic light emitting diode (OLED) display device having relatively enhanced light efficiency, and significantly reduced color distortion based on a viewing angle.

According to an embodiment of the present invention, an OLED display device includes: a first substrate including red, green, and blue pixel areas; a first electrode on the first substrate; red, green, and blue organic light emitting layers on the first electrode at the red, green, and blue pixel areas, respectively; a second electrode on the red, green, and blue organic light emitting layers; a capping layer on the second electrode, and having a greater thickness at the red and green pixel areas than a thickness at the blue pixel area; a thin film encapsulation layer on the capping layer; and a red color filter on the thin film encapsulation layer at the red pixel area.

The capping layer may have a same thickness in the red and green pixel areas.

The capping layer may have a thickness in a range of 30 nanometers (nm) to 150 nm at the red and green pixel areas, and a thickness in a range of 20 nm to 60 nm at the blue pixel area:

The capping layer may have a refractive index in a range of 1.8 to 3.0.

The capping layer may have a greater thickness at the red pixel area than a thickness at the green pixel area.

The capping layer may have a thickness in a range of 40 nm to 150 nm at the red pixel area, a thickness in a range of 30 nm to 140 nm at the green pixel area, and a thickness in a range of 20 nm to 60 nm at the blue pixel area.

The capping layer may have a refractive index in a range of 1.8 to 3.0.

The capping layer may include a first refractive-index layer comprising at least a first low-refractive-index layer and at least a first high-refractive-index layer at the red, green, and blue pixel areas, and a second refractive-index layer on the first refractive-index layer at the red and green pixel areas.

The first low-refractive-index layer and the first high-refractive-index layer may be arranged sequentially.

The second refractive-index layer may be on the first low-refractive-index layer.

The second refractive-index layer may be on the first high-refractive-index layer.

The first low-refractive-index layer may have a refractive index in a range of 1.2 to 1.8, and the first high-refractive-index layer and the second refractive-index layer may have a refractive index in a range of 1.8 to 3.0.

The first low-refractive-index layer may have a thickness in a range of 10 nm to 30 nm, the first high-refractive-index layer may have a thickness in a range of 10 nm to 50 nm, and the second refractive-index layer may have a thickness in a range of 5 nm to 80 nm.

The second refractive-index layer may have a same thickness at the red and green pixel areas.

The second refractive-index layer may have a greater thickness at the red pixel area than a thickness at the green pixel area.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention of invention will be more clearly understood from the following detailed description taken in conjunction with the accompanying drawings, in which.

DETAILED DESCRIPTION

Figure 1:
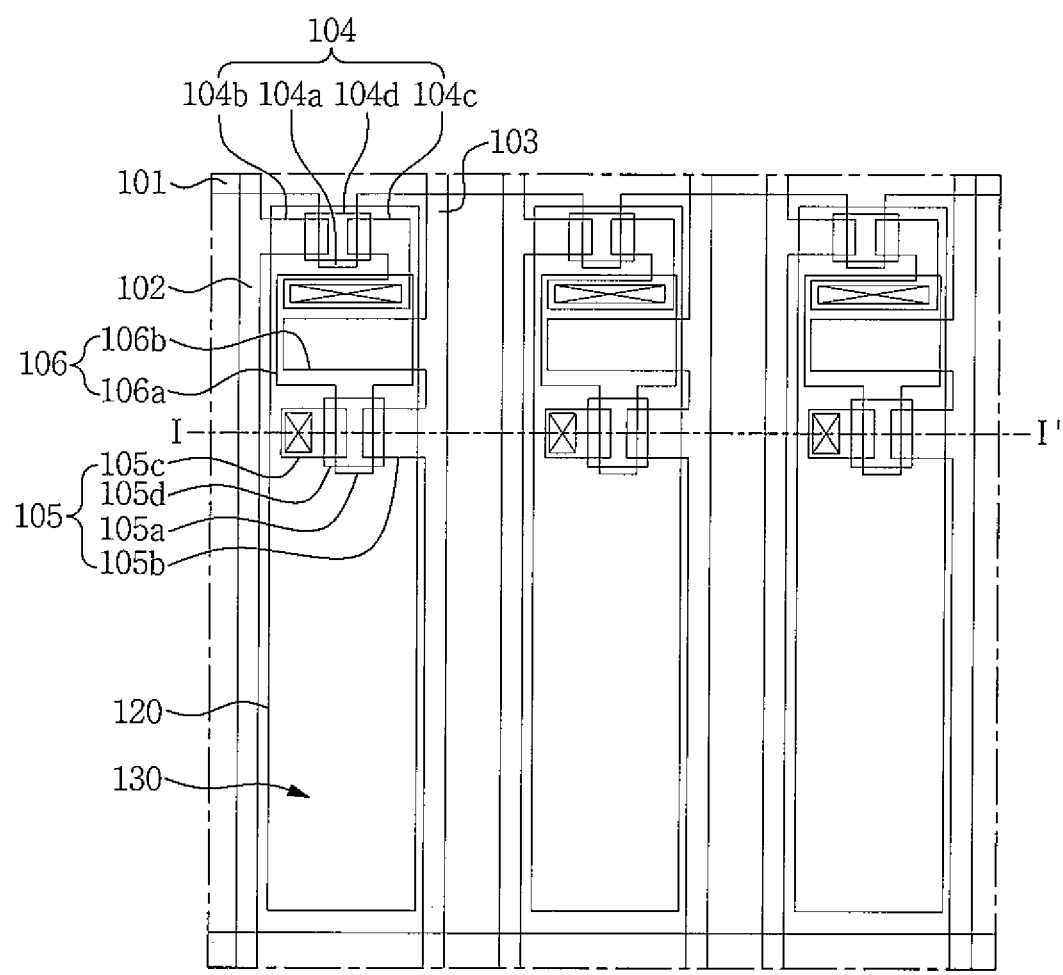
FIG. 1 is a plan view illustrating an organic light emitting diode (OLED) display device according to the present invention.

Aspects and features of the present invention and methods for achieving them will be made clear from example embodiments described below in more detail with reference to the accompanying drawings. The present invention may, however, be embodied in many different forms and should not be construed as being limited to the example embodiments set forth herein. Rather, these example embodiments are provided so that this disclosure will be more thorough and more complete, and will more fully convey the scope of the invention to those skilled in the art. The present invention is merely defined by the scope of the claims. Therefore, well-known constituent elements, operations and techniques may not be described in detail in the example embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relationship between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

All terminologies used herein are merely used to describe embodiments of the inventive concept and may be modified according to the relevant art and the intention of an applicant. Therefore, the terms used herein should be interpreted as having a meaning that is consistent with their meanings in the context of the present disclosure, and is not intended to limit the invention. As used herein, the singular forms "a," "an," and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
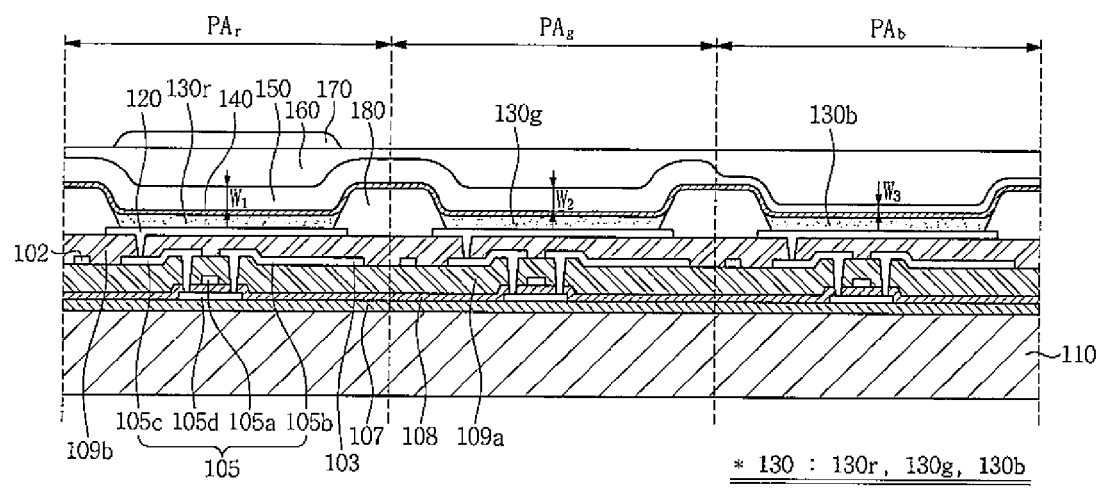
FIG. 2 is a cross-sectional view taken along line I-I' of FIG. 1 according to a first example embodiment of the present invention.

FIG. 1 is a plan view illustrating an organic light emitting diode (OLED) display device according to some embodiments of the present invention; and FIG. 2 is a cross-sectional view taken along the line I-I' of FIG. 1 according to a some example embodiments of the present invention.

Referring to FIGS. 1 and 2, an OLED display device according to the present invention may include a gate line 101, a data line 102 insulated from and intersecting the gate line 101, a common power line 103, a switching thin film transistor (TFT) 104, a driving TFT 105, and a capacitor (CAP) 106.

In other words, a single pixel of the OLED display device according to the present invention may have a 2TFT-1 CAP structure including two thin film transistors, for example, the switching TFT 104 and the driving TFT 105, and a single capacitor, for example, the CAP 106. However, the structure of the pixel of the OLED display device is not limited thereto, and three or more thin film transistors and two or more capacitors may be included in a single pixel.

The switching TFT 104 may select a pixel to perform light emission. The switching TFT 104 may include a switching gate electrode 104a connected to the gate line 101, a switching source electrode 104b connected to the data line 102, a switching drain electrode 104c connected to a first capacitor plate 106a, and a switching semiconductor layer 104d.

The driving TFT 105 may apply driving power for allowing an organic light emitting layer 130 in the pixel selected by the switching TFT 104 to perform light emission. The driving TFT 105 may include a driving gate electrode 105a connected to the first capacitor plate 106a, a driving source electrode 105b connected to the common power line 103, a driving drain electrode 105c connected to the first electrode 110, and a driving semiconductor layer 105d.

The CAP 106 may include the first capacitor plate 106a and a second capacitor plate 106b. The first capacitor plate 106a may be connected to the switching drain electrode 104c and the driving gate electrode 105a, and the second capacitor plate 106b may be connected to the common power line 103. Capacitance of the CAP 106 may be determined by electric charges stored in the CAP 106 and voltages between the first capacitor plate 106a and the second capacitor plate 106b.

A voltage having a level equivalent to a difference between a level of a data voltage transmitted by (or from) the switching TFT 104 and a level of a common voltage applied from the common power line 103 to the driving TFT 105 may be stored in the CAP 106, and a current having a level equivalent to the level of the voltage stored in the CAP 106 may flow to the organic light emitting layer 130 through the driving TFT 105 to allow the organic light emitting layer 130 to perform light emission.

The first substrate 110 may use (or include) an insulating substrate formed of any suitable insulating substrate materials such as glass, quartz, ceramic, plastic, and the like. However, the material forming the first substrate 110 is not limited thereto. Accordingly, the first substrate 110 may also use (or include) a metallic substrate material, for example, stainless steel, or the like.

The first substrate 110 may include red, green, and blue pixel areas $PA_r$, $PA_g$, and $PA_b$. The red, green, and blue pixel areas $PA_r$, $PA_g$, and $PA_b$ may be defined by a pixel defining layer 180, which is to be described further below, and may be arranged or formed on the first substrate 110.

A buffer layer 107 may be arranged or formed on the first substrate 110. The buffer layer 107 may prevent or efficiently reduce the infiltration of undesired components or external contaminants such as moisture or impure elements through the first substrate 110 and may also planarize a surface of the first substrate 110. The buffer layer 107 may be formed of one of an inorganic insulating layer and an organic insulating layer. For example, the buffer layer 107 may be deposited on the first substrate 110 through various types of deposition processes such as a plasma enhanced chemical vapor deposition (PECVD) process, an atmospheric pressure CVD (APCVD) process, or a low pressure CVD (LPCVD) process, in which $SiO_2$, $SiN_x$, or the like, are used. However, the deposition of the buffer layer 107 is not limited thereto, and according to some embodiments, the buffer layer 107 may be omitted.

The driving semiconductor layer 105d may be arranged or formed on the buffer layer 107, and may include a source region, a drain region, and a channel region between the source region and the drain region.

A gate insulating layer 108 may be arranged or formed on the buffer layer 107 to cover the driving semiconductor layer 105d, and may prevent or efficiently reduce the infiltration of undesired components or external contaminants such as moisture or impure elements through the first substrate 110. The gate insulating layer 108 may be formed of an insulating material, and may have a monolayer or multilayer structure formed of silicon nitride ($SiN_x$) or silicon oxide ($SiO_x$). However, the material forming the gate insulating layer 108 is not limited thereto, and the gate insulating layer 108 may be formed of various insulating materials.

The driving gate electrode 105a may be arranged or formed on the gate insulating layer 108, and an insulating interlayer 109a may be arranged or formed on the gate insulating layer 108 to cover the driving gate electrode 105a.

The driving source electrode 105b and the driving drain electrode 105c may be arranged or formed on the insulating interlayer 109a to be spaced apart from one another, and may contact the source region and the drain region of the driving semiconductor layer 105d through respective apertures, each of the apertures being formed in the gate insulating layer 108 and the insulating interlayer 109a.

A protection layer 109b may be arranged or formed on the insulating interlayer 109a to cover the driving source electrode 105b and the driving drain electrode 105c. The protection layer 109b may protect the driving TFT 105, and may be formed of an inorganic insulating layer and an organic insulating layer.

The first electrode 120, the organic light emitting layer 130, and the second electrode 140 may be sequentially arranged or positioned on the protection layer 109b. The first electrode 120 may be an anode that injects holes and the second electrode 140 may be a cathode that injects electrons. However, the configuration of the first and second electrodes 120 and 140 is not limited thereto, and the first electrode 120 may be a cathode and the second electrode 140 may be an anode.

The organic light emitting layer 130 may include red, green, and blue organic light emitting layers 130r, 130g, and 130b. The red, green, and blue organic light emitting layers 130r, 130g, and 130b may be arranged or formed in the red, green, and blue pixel areas $PA_r$, $PA_g$, and $PA_b$, respectively. The organic light emitting layer 130 may include a low molecular weight organic material or a polymer organic material.

At least one of a hole injection layer and a hole transporting layer may further be interposed between the first electrode 120 and the organic light emitting layer 130, and at least one of an electron transporting layer and an electron injection layer may further be interposed between the organic light emitting layer 130 and the second electrode 140.

The OLED display device according to some example embodiments may be a top-emission-type display device. Accordingly, the first electrode 120 may include a reflective layer and the second electrode 140 may include a transflective layer. However, the type of the OLED display device according some example embodiments is not limited thereto, and the OLED display device according to some example embodiments may be modified into a bottom-emission-type display device. In this case, the first electrode 120 may include a transflective layer and the second electrode 140 may include a reflective layer.

The reflective layer and the transflective layer may include one or more metals of magnesium (Mg), silver (Ag), gold (Au), calcium (Ca), lithium (Li), chromium (Cr), and aluminum (Al) or a metal alloy thereof. The type of the layer, that is, whether the reflective layer or the transflective layer, may be determined based on the thickness of the layer. In general, the transflective layer has a thickness of less than or equal to about 200 nanometers (nm).

The first electrode 120 may further include a transparent conductive layer, and the transparent conductive layer may include transparent conductive oxide (TCO) such as indium tin oxide (ITO), indium zinc oxide (IZO), zinc oxide (ZnO), or indium oxide ($In_2O_3$).

The first electrode 120 may have a structure including a reflective layer, a double-layer structure including a reflective layer and a transparent conductive layer, or a triple-layer structure in which a transparent conductive layer, a reflective layer, and a transparent conductive layer are sequentially stacked. However, the structure of the first electrode 120 is not limited thereto, and the first electrode 120 may have a structure including a transparent conductive layer.

The second electrode 140 may have a structure including a transparent conductive layer. In the case of including a transparent conductive layer, the second electrode 140 may be an anode that injects holes and the first electrode 120 may include a reflective layer to serve as a cathode.

The pixel defining layer 180 may be arranged or formed on the first electrode 120 to cover an edge portion of the first electrode 120 and may have a predetermined aperture through which a center portion of the first electrode 120 is exposed. In other words, the first electrode 120, the organic light emitting layer 130, and the second electrode 140 may be sequentially stacked within the aperture of the pixel defining layer 180. Further, the organic light emitting layer 130 and the second electrode 140 may be formed on the pixel defining layer 180.

A capping layer 150 may be arranged or formed on the second electrode 140. The capping layer 150 may protect the first electrode 120, the organic light emitting layer 130, and the second electrode 140, and may assist in efficient dissipation of light generated in the organic light emitting layer 130, externally of the OLED display device.

The capping layer 150 may have a greater thickness in the red and green pixel areas $PA_r$ and $PA_g$ than that in the blue pixel area $PA_b$.

For example, the capping layer 150 may have a first thickness $W_1$ in the red pixel area $PA_r$, a second thickness $W_2$ in the green pixel area $PA_g$, and a third thickness $W_3$ in the blue pixel area $PA_b$.

In this instance, the first thickness $W_1$ and the second thickness $W_2$ may be the same as one another, and the first thickness $W_1$ and the second thickness $W_2$ may be greater than the third thickness $W_3$. For the enhanced light extraction efficiency of the OLED display device, the first thickness $W_1$ and the second thickness $W_2$ may be in a range of about 30 nm to about 150 nm, and the third thickness $W_3$ may be in a range of about 20 nm to about 60 nm.

The capping layer 150 may have a refractive index in a range of about 1.8 to about 2.5, and may be formed of at least one of an inorganic material and an organic material. Accordingly, the capping layer 150 may be formed of one of an inorganic layer and an organic layer, or may be formed of an organic layer containing inorganic particles.

Such inorganic materials applicable to the capping layer 150 may include, for example, zinc oxide, titanium oxide, zirconium oxide, niobium oxide, tantalum oxide, tin oxide, nickel oxide, silicon nitride, indium nitride, and gallium nitride.

Such organic materials applicable to the capping layer 150 may include, for example, poly (3,4-ethylenedioxythiophene) (PEDOT), 4,4'-bis [N-(3-methylphenyl)-N-phenyl amino]biphenyl (TPD), 4,4',4"-tris[(3-methylphenyl)phenyl amino]triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4'-bis[N,N-bis(3-methylphenyl)-amino]-diphenylmethane (BPPM), 4,4'-dicarbazolyl-1,1'-biphenyl (CBP), 4,4',4"-tris(N-carbazole)triphenylamine (TCTA), 2,2',2"'-(1,3,5-benzenetolyl)tris-[1-phenyl-1H-benzoimidazol] (TPBI), and 3-(4-biphenyl)-4-phenyl-5-t-butylphenyl-1,2,4-triazole (TAZ).

A thin film encapsulation layer 160 may be arranged or formed on the capping layer 150, and may encapsulate and protect the first electrode 120, the organic light emitting layer 130, the second electrode 140, and the capping layer 150 from the infiltration of external moisture or oxygen thereinto.

The thin film encapsulation layer 160 may have a structure in which at least an organic layer and at least an inorganic layer are alternately stacked. However, the structure of the thin film encapsulation layer 160 is not limited thereto, and the thin film encapsulation layer 160 may have a monolayer structure including one of an inorganic layer and an organic layer.

A red color filter 170 may be arranged or formed on the thin film encapsulation layer 160 in the red pixel area $PA_r$, and may include a red material or an organic material in which red materials are dispersed.

The OLED display device according to some example embodiments may enhance the light extraction efficiency thereof by including the capping layer 150, having a greater thickness in the red and green pixel areas $PA_r$ and $PA_g$ than that in the blue pixel area $PA_b$. However, there may arise an issue of a color distortion phenomenon that occurs based on a viewing angle, more particularly, a phenomenon in which a reddish color is displayed. In this regard, the OLED display device according to some example embodiments may include the red color filter 170 in the red pixel area $PA_r$, thereby enhancing the light extraction efficiency thereof and significantly reducing the color distortion phenomenon occurring based on a viewing angle.

Figure 3:
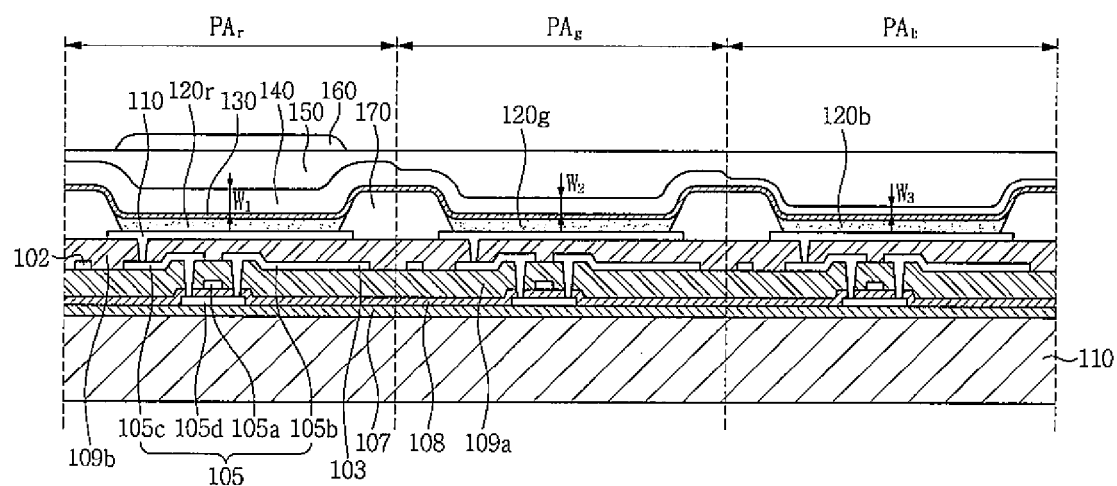
FIG. 3 is a cross-sectional view taken along line I-I' of FIG. 1 according to a second example embodiment of the present invention.

FIG. 3 is a cross-sectional view taken along line of FIG. 1 according to another example embodiment of the present invention. Referring to FIG. 3, since the OLED display device of FIG. 3 according to some example embodiments has the same configuration as that of the OLED display device of FIG. 2, aside from a capping layer 150, and some repetitive description thereof may be omitted for conciseness.

The capping layer 150 may have a greater thickness in a red pixel area $PA_r$ than that in green and blue pixel areas $PA_g$ and $PA_b$, and may have a greater thickness in the green pixel area $PA_g$ than that in the blue pixel area $PA_b$.

For example, the capping layer 150 may have a first thickness $W_1$ in the red pixel area $PA_r$, a second thickness $W_2$ in the green pixel area $PA_g$, and a third thickness $W_3$ in the blue pixel area $PA_b$.

In this instance, the first thickness $W_1$ may be greater than the second thickness $W_2$ and the third thickness $W_3$, and the second thickness $W_2$ may be greater than the third thickness $W_3$. For the enhanced light extraction efficiency of the OLED display device, the first thickness $W_1$ may be in a range of about 40 nm to about 150 nm, the second thickness $W_2$ may be in a range of about 30 nm to about 140 nm, and the third thickness $W_3$ may be in a range of about 20 nm to about 60 nm.

The capping layer 150 may have a refractive index in a range of about 1.8 to about 2.5. Because the capping layer 150 is formed of the same material as that of the capping layer 150 of FIG. 1, some repetitive description thereof may be omitted for conciseness.

Figure 4:
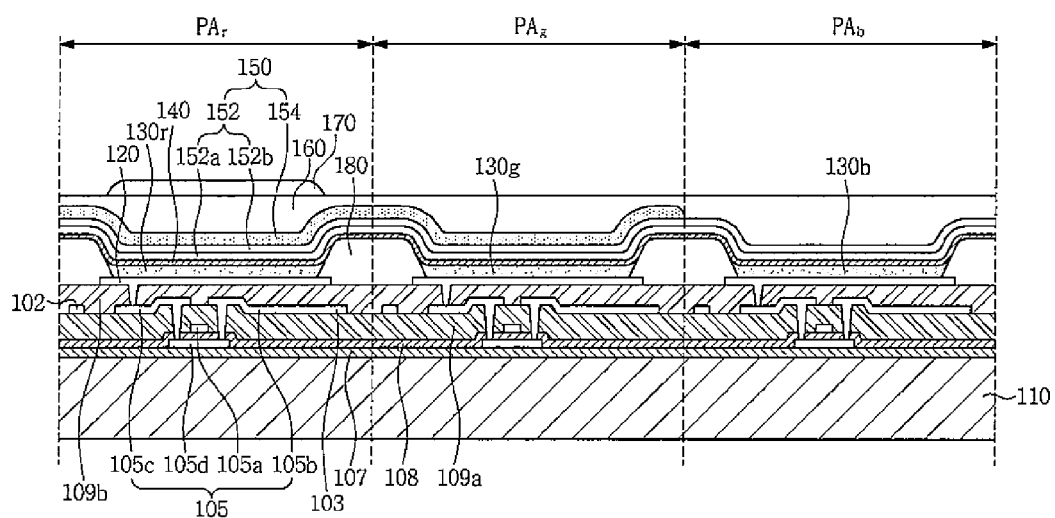
FIG. 4 is a cross-sectional view taken along line I-I' of FIG. 1 according to a third example embodiment of the present invention.

FIG. 4 is a cross-sectional view taken along line I-I' of FIG. 1 according to another example embodiment of the present invention. Referring to FIG. 4, because the OLED display device of FIG. 4 has the same configuration as that of the OLED display device of FIG. 2, aside from a capping layer 150, some repetitive description thereof may be omitted for conciseness.

The capping layer 150 may include a first refractive-index layer 152 arranged or positioned in red, green, and blue pixel areas $PA_r$, $PA_g$, and $PA_b$, and a second refractive-index layer 154 arranged or positioned in the red and green pixel areas $PA_r$ and $PA_g$.

The first refractive-index layer 152 may include a first low-refractive-index layer 152a and a first high-refractive-index layer 152b. The first low-refractive-index layer 152a, the first high-refractive-index layer 152b, and the second refractive-index layer 154 may be sequentially arranged or positioned on a second electrode 140.

The first refractive-index layer 152 may have the same thickness in the red, green, and blue pixel areas $PA_r$, $PA_g$, and $PA_b$, and the second refractive-index layer 154 may have the same thickness in the red and green pixel areas $PA_r$ and $PA_g$. In this instance, the first low-refractive-index layer 152a may have a thickness in a range of about 10 nm to about 30 nm, the first high-refractive-index layer 152b may have a thickness in a range of about 10 nm to about 50 nm, and the second refractive-index layer 154 may have a thickness in a range of about 5 nm to about 80 nm.

The first low-refractive-index layer 152a may have a refractive index in a range of about 1.2 to about 1.8. The first low-refractive-index layer 152a may be formed of at least one of an inorganic material and an organic material. Accordingly, the first low-refractive-index layer 152a may include one of an inorganic layer and an organic layer, or may include an organic layer containing inorganic particles.

Such inorganic materials applicable to the first low-refractive-index layer 152a may include, for example, silicon oxide and magnesium fluoride.

Such organic materials applicable to the first low-refractive-index layer 152a may include, for example, acrylic, polyimide, polyamide, and Alq₃[Tris(8-hydroxyquinolinato) aluminum].

The first high-refractive-index layer 152b and the second refractive-index layer 154 may have a refractive index in a range of about 1.8 to about 3.0. Because the first high-refractive-index layer 152b and the second refractive-index layer 154 are formed of the same material as that of the capping layer 150 of FIG. 1, some repetitive description thereof may be omitted for conciseness.

Figure 5:
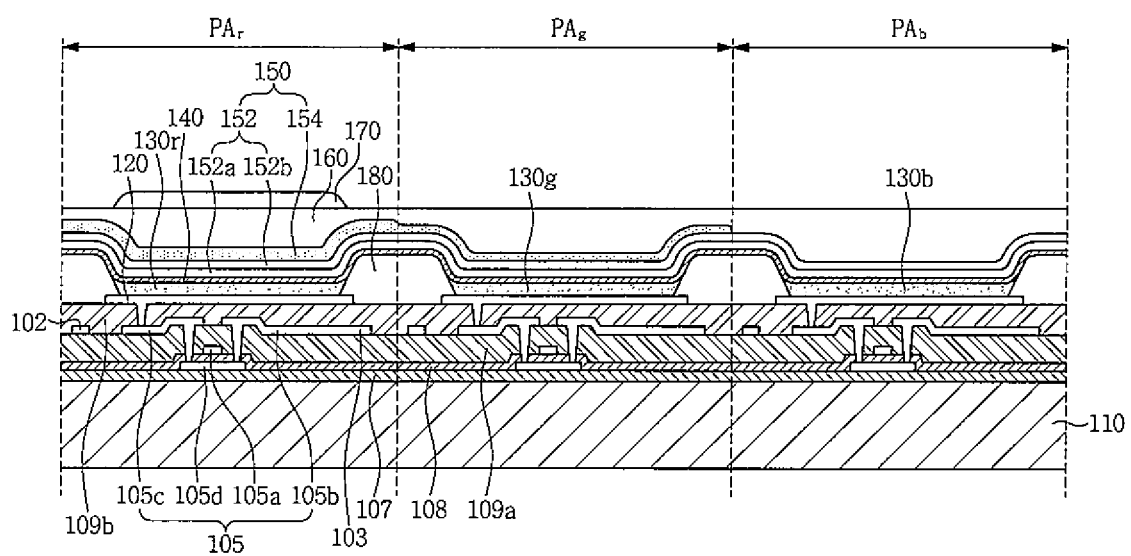
FIG. 5 is a cross-sectional view taken along line I-I' of FIG. 1 according to a fourth example embodiment of the present invention.

FIG. 5 is a cross-sectional view taken along line I-I' of FIG. 1 according to another example embodiment of the present invention. Referring to FIG. 5, because the OLED display device of FIG. 5 may have the same configuration as that of the OLED display device of FIG. 4, aside from a second refractive-index layer 154, some repetitive description thereof may be omitted for conciseness.

The second refractive-index layer 154 may have a greater thickness in a red pixel area $PA_r$ than that in a green pixel area $PA_g$. In this instance, the second refractive-index layer 154 may have a thickness in a range of about 5 nm to about 80 nm.

The second refractive-index layer 154 may have a refractive index in a range of about 1.8 to about 2.5. Because the second refractive-index layer 154 is formed of the same material as that of the capping layer 150 of FIG. 1, some repetitive description thereof may be omitted for conciseness.

Figure 6:
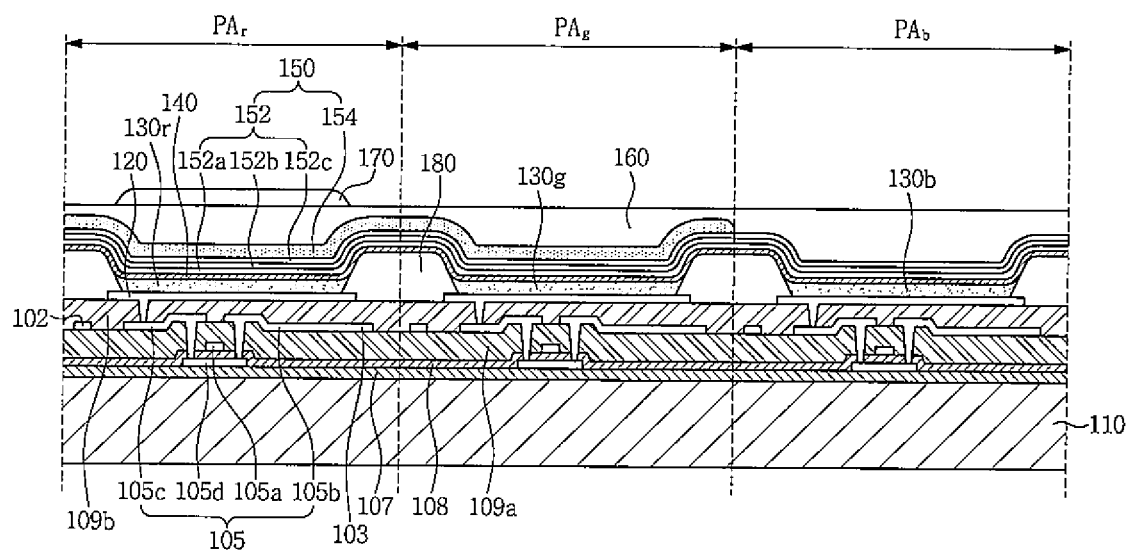
FIG. 6 is a cross-sectional view taken along line I-I' of FIG. 1 according to a fifth example embodiment of the present invention.

FIG. 6 is a cross-sectional view taken along the line I-I' of FIG. 1 according to some example embodiments of the present invention. Referring to FIG. 6, because the OLED display device of FIG. 6 may have the same configuration as that of the OLED display device of FIG. 4, aside from a first refractive-index layer 152, some repetitive description thereof may be omitted for conciseness.

The first refractive-index layer 152 may include a first low-refractive-index layer 152*a*, a first high-refractive-index layer 152*b*, and a second low-refractive-index layer 152*c*. The first low-refractive-index layer 152*a*, the first high-refractive-index layer 152*b*, the second low-refractive-index layer 152*c*, and a second refractive-index layer 154 may be sequentially arranged or positioned on a second electrode 140.

The first refractive-index layer 152 may have the same thickness in red, green, and blue pixel areas $PA_r$, $PA_g$, and $PA_b$. In this instance, the first low-refractive-index layer 152*a* and the second low-refractive-index layer 152*c* may have a thickness in a range of about 10 nm to about 30 nm, and the first high-refractive-index layer 152*b* may have a thickness in a range of about 10 nm to about 50 nm.

Figure 7:
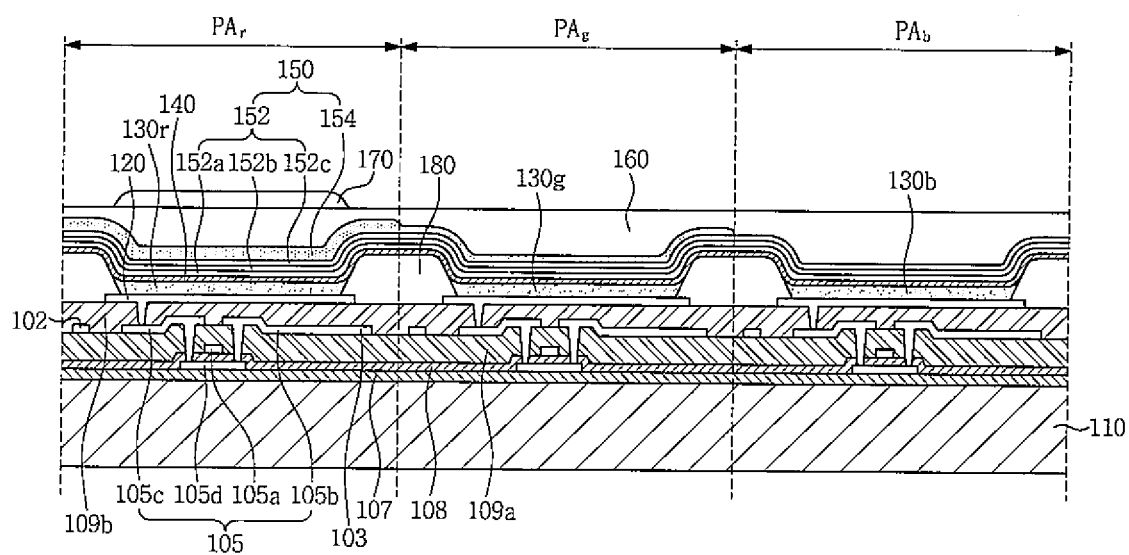
FIG. 7 is a cross-sectional view taken along line I-I' of FIG. 1 according to a sixth example embodiment of the present invention.

FIG. 7 is a cross-sectional view taken along the line I-I' of FIG. 1 according to another example embodiment of the present invention. Referring to FIG. 7, because the OLED display device of FIG. 7 may have the same configuration as that of the OLED display device of FIG. 5, aside from a first refractive-index layer 152, some repetitive description thereof may be omitted for conciseness.

The first refractive-index layer 152 may include a first low-refractive-index layer 152*a*, a first high-refractive-index layer 152*b*, and a second low-refractive-index layer 152*c*. The first low-refractive-index layer 152*a*, the first high-refractive-index layer 152*b*, the second low-refractive-index layer 152*c*, and a second refractive-index layer 154 may be sequentially arranged or positioned on a second electrode 140.

The first refractive-index layer 152 may have the same thickness in red, green, and blue pixel areas $PA_r$, $PA_g$, and $PA_b$. In this instance, the first low-refractive-index layer 152*a* and the second low-refractive-index layer 152*c* may have a thickness in a range of about 10 nm to about 30 nm, and the first high-refractive-index layer 152*b* may have a thickness in a range of about 10 nm to about 50 nm.

As set forth above, according to some example embodiments, the OLED display device may enhance the light efficiency thereof and may significantly reduce the color distortion phenomenon occurring based on a viewing angle.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and their equivalents.

What is claimed is:

1. An organic light emitting diode (OLED) display device comprising:
   a first substrate comprising red, green, and blue pixel areas;
   a first electrode on the first substrate;
   red, green, and blue organic light emitting layers on the first electrode at the red, green, and blue pixel areas, respectively;
   a second electrode on the red, green, and blue organic light emitting layers;
   a capping layer on the second electrode, and having a greater thickness at the red and green pixel areas than a thickness at the blue pixel area;
   a thin film encapsulation layer on the capping layer; and
   a red color filter on the thin film encapsulation layer at the red pixel area.

2. The organic light emitting diode display device of claim 1, wherein the capping layer has a same thickness in the red and green pixel areas.

3. The organic light emitting diode display device of claim 2, wherein the capping layer has a thickness in a range of 30 nanometers (nm) to 150 nm at the red and green pixel areas, and a thickness in a range of 20 nm to 60 nm at the blue pixel area.

4. The organic light emitting diode display device of claim 2, wherein the capping layer has a refractive index in a range of 1.8 to 3.0.

5. The organic light emitting diode display device of claim 1, wherein the capping layer has a greater thickness at the red pixel area than a thickness at the green pixel area.

6. The organic light emitting diode display device of claim 5, wherein the capping layer has a thickness in a range of 40 nm to 150 nm at the red pixel area, a thickness in a range of 30 nm to 140 nm at the green pixel area, and a thickness in a range of 20 nm to 60 nm at the blue pixel area.

7. The organic light emitting diode display device of claim 5, wherein the capping layer has a refractive index in a range of 1.8 to 3.0.

8. The organic light emitting diode display device of claim 1, wherein the capping layer comprises a first refractive-index layer comprising at least a first low-refractive-index layer and at least a first high-refractive-index layer at the red, green, and blue pixel areas, and a second refractive-index layer on the first refractive-index layer at the red and green pixel areas.

9. The organic light emitting diode display device of claim 8, wherein the first low-refractive-index layer and the first high-refractive-index layer are arranged sequentially.

10. The organic light emitting diode display device of claim 9, wherein the second refractive-index layer is on the first low-refractive-index layer.

11. The organic light emitting diode display device of claim 9, wherein the second refractive-index layer is on the first high-refractive-index layer.

12. The organic light emitting diode display device of claim 8, wherein the first low-refractive-index layer has a refractive index in a range of 1.2 to 1.8, and the first high-refractive-index layer and the second refractive-index layer have a refractive index in a range of 1.8 to 3.0.

13. The organic light emitting diode display device of claim 8, wherein the first low-refractive-index layer has a thickness in a range of 10 nm to 30 nm, the first high-refractive-index layer has a thickness in a range of 10 nm to 50 nm, and the second refractive-index layer has a thickness in a range of 5 nm to 80 nm.

14. The organic light emitting diode display device of claim 13, wherein the second refractive-index layer has a same thickness at the red and green pixel areas.

15. The organic light emitting diode display device of claim 13, wherein the second refractive-index layer has a greater thickness at the red pixel area than a thickness at the green pixel area.

* * * * *